(12) United States Patent
Zhang

(10) Patent No.: US 11,189,504 B2
(45) Date of Patent: Nov. 30, 2021

(54) PHOTORESIST STRIPPING DEVICE AND PHOTORESIST STRIPPING METHOD

(71) Applicant: TCL CHINA STAR OPTOELECTRONICS TECHNOLOGY CO., LTD., Shenzhen (CN)

(72) Inventor: Yuehong Zhang, Shenzhen (CN)

( * ) Notice: Subject to any disclaimer, the term of this patent is extended or adjusted under 35 U.S.C. 154(b) by 0 days.

(21) Appl. No.: 16/764,887

(22) PCT Filed: Mar. 24, 2020

(86) PCT No.: PCT/CN2020/080779
§ 371 (c)(1),
(2) Date: May 18, 2020

(87) PCT Pub. No.: WO2021/159587
PCT Pub. Date: Aug. 19, 2021

(65) Prior Publication Data
US 2021/0247696 A1    Aug. 12, 2021

(30) Foreign Application Priority Data
Feb. 11, 2020   (CN) .......................... 202010087451.9

(51) Int. Cl.
*H01L 21/67*        (2006.01)
*G03F 7/42*         (2006.01)
*H01L 21/677*       (2006.01)

(52) U.S. Cl.
CPC ........ *H01L 21/67075* (2013.01); *G03F 7/422* (2013.01); *H01L 21/677* (2013.01)

(58) Field of Classification Search
CPC .. H01L 21/67075; H01L 21/677; G03F 7/422
See application file for complete search history.

(56) References Cited

U.S. PATENT DOCUMENTS

| 4,722,355 A | * | 2/1988 | Moe | ........................ | G03F 7/422 |
| | | | | | 134/103.2 |
| 5,753,135 A | * | 5/1998 | Jablonsky | ............. | G03F 7/3092 |
| | | | | | 216/93 |

(Continued)

FOREIGN PATENT DOCUMENTS

| CN | 103012494 A | 4/2013 |
| CN | 103995441 A | 8/2014 |

(Continued)

OTHER PUBLICATIONS

[Angewandte Chemie] Jinyu Zeng, ETC. Sturctural Transformation in Medtal-Organic Framework for Reversible Binding of Oxygen.

*Primary Examiner* — Mohammed Shamsuzzaman

(57) ABSTRACT

The present disclosure provides a photoresist stripping device and a photoresist stripping method. The photoresist stripping device including a conveyor belt, a liquid storage tank, a filtering device, a lighting device and a stripping tank. Through disposing a metal-organic framework (MOF) material in a filter element, the MOF material is configured to adsorb a dissolved oxygen of the stripping solution in a visible light environment, thereby reducing the difference in oxygen concentration between the inside and outside of the gap, and alleviating hollowing out phenomenon of copper caused by stripping the photoresist of the substrate. Further, when reaching a saturation step, can heat or emit ultraviolet light to release the dissolved oxygen to make the filter material recyclable.

6 Claims, 3 Drawing Sheets

(56) References Cited

U.S. PATENT DOCUMENTS

| | | | | |
|---|---|---|---|---|
| 6,074,561 | A | * | 6/2000 | Jablonsky ............... G03F 7/30 |
| | | | | 210/650 |
| 6,513,539 | B2 | * | 2/2003 | Tanaka ............... G03D 3/132 |
| | | | | 134/122 P |
| 2008/0092925 | A1 | * | 4/2008 | Hong ............... H01L 21/6708 |
| | | | | 134/21 |
| 2016/0238943 | A1 | | 8/2016 | Zhang |

FOREIGN PATENT DOCUMENTS

| | | |
|---|---|---|
| CN | 106462088 A | 2/2017 |
| CN | 108227411 A | 6/2018 |
| CN | 109254506 A | 1/2019 |
| CN | 110047735 A | 7/2019 |

* cited by examiner

Prior Art

PHOTORESIST STRIPPING DEVICE AND PHOTORESIST STRIPPING METHOD

FIELD OF INVENTION

The present disclosure relates to the field of display technologies, and more particularly, to a photoresist stripping device and a photoresist stripping method.

BACKGROUND OF INVENTION

With displays getting larger and high-definition pictures, a low resistivity metal is is needed for an electronic transmission wire. Currently, copper can meet high conductivity and relatively low price requirements. However, due to poor adhesion to a glass substrate, and easy diffusion into the oxy-silicon or nitrogen-silicon film, a thin buffer layer is added between the electronic transmission wire and the glass substrate, wherein a material of the buffer layer is generally molybdenum or a molybdenum alloy.

The method of forming microcircuit patterns of semiconductors, thin-film transistor liquid crystal displays (TFT-LCDs), and organic light-emitting diode (OLED) displays includes the following processes: first, forming a film of copper-molybdenum or alloy thereof with a certain thickness on a glass substrate or an insulating layer, then forming a pattern through a photoresist coating exposure and development process, next, etching a metal outside the pattern with a copper acid etchant, removing photoresist with a photoresist stripping solution, and then patterning the metal film layer to form an electrode circuit.

Generally, metals have different electrode potentials in different solution systems, and the electrode potentials of copper (Cu) and molybdenum (Mo) in the same solution system are also different. In acidic solutions, an electrode potential of molybdenum is less than an electrode potential of copper. Because the electrode potentials of copper and molybdenum are different, galvanic corrosion will form between the two metals which are in contact with each other in the conductive solution, wherein the molybdenum is configured to an anode and the copper is configured to a cathode. As shown in FIG. 1, since the metal etching process occurs in an acidic etching solution, a molybdenum undercut 22 and Cu undercut will occur between copper and molybdenum at the end of the metal etching process, which leads to a formation of a gap 23. Stripping the photoresist occurs in an alkaline photoresist stripping solution, in which the electrode potential of copper and molybdenum is reversed, the copper is configured to the anode, the molybdenum is configured to the cathode, and the copper is further corroded to form a hole 21. A driving force of forming the hole 21 is composed of a concentration differences between anions and oxygen inside and outside the gap, and an electrical potential difference between the copper surface of inside and outside the gap. The lower layer of molybdenum is also corroded, causing the gap 23 larger and larger, the concentration difference between anions and oxygen inside and outside the gap becomes less, and the driving force for the gap corrosion in the hole becomes less. At the same time, deepest part of the gap has greatest concentration difference between anions and oxygen inside and outside the gap, where the corrosion activity is strongest, thereby forming a new hole when new point of the gap is corroded and the corrosion spreads to a deeper position.

Therefore, it is urgent to provide a new photoresist stripping device and a new photoresist stripping method to alleviate the phenomenon of Cu undercut.

SUMMARY OF INVENTION

The object of the present disclosure is to provide a photoresist stripping device and a photoresist stripping method. The photoresist stripping device including a conveyor belt, a liquid storage tank, a filtering device, a lighting device, and a stripping tank, through disposing a metal-organic framework (MOF) material in a filter element, the MOF material is configured to adsorb a dissolved oxygen of the stripping solution in a visible light environment, thereby reducing the difference in oxygen concentration between the inside and outside of the gap, and alleviating hollowing out phenomenon of copper caused by stripping the photoresist of the substrate. Further, when reaching a saturation step, can heat or emit ultraviolet light to release the dissolved oxygen to make the filter material recyclable.

To achieve the above object, the present disclosure provides a photoresist stripping device, including a conveyor belt configured to carry and convey a substrate having a photoresist layer to be stripped; a liquid storage tank configured to store a stripping solution and comprising a liquid discharge port; a filtering device comprising a filter element having a metal-organic framework (MOF) material, wherein the filtering device is connected to the liquid storage tank, and the MOF material is configured to adsorb a dissolved oxygen of the stripping solution in a visible light environment; a lighting device configured to light the filtering device; and a stripping tank disposed on the liquid storage tank and the filtering device and comprising an inlet, an outlet, a first connection hole, and a second connection hole, wherein the first connection hole is connected to the filtering device and configured to receive the stripping solution from the filtering device to spray the substrate, the second connection hole is connected to the liquid storage tank to recycle the stripping solution, the stripping tank further comprises a plurality of spray heads disposed in an array on a top of the stripping tank and connected to the filtering device through the first connection hole to spray the stripping solution on the photoresist layer, and an air knife disposed on the outlet to remove the stripping solution on the substrate; wherein the conveyor belt penetrates the outlet and the inlet.

Further, the filtering device further comprises a heating device configured to heat the filter element to release the dissolved oxygen adsorbed by the MOF material.

Further, the filtering device further comprises a cooling device configured to consume a heat generated through the heating device and maintain a stable temperature environment of the filtering device.

Further, the filtering device further comprises a cooling device configured to consume a heat generated by the heating device and maintain a stable temperature environment of the filtering device.

Further, the heating device comprises an ultraviolet lamp; and/or the lighting device comprises an incandescent lamp; and/or the filtering device is connected to the liquid storage tank through a pump.

Further, a cross-section of a bottom of the stripping tank is an isosceles triangle, and the second connection hole is disposed on a center of the bottom of the stripping tank.

Further, the photoresist stripping device further including a vacuum device configured to evacuate the stripping tank.

Further, the stripping tank comprises a pipe that penetrates the bottom of the stripping tank, and the pipe is connected to the filtering device.

The present disclosure further provides a photoresist stripping method, including providing a substrate having a photoresist layer to be stripped and the photoresist stripping device described above; transferring the substrate to the inlet; pumping the stripping solution through a pump to the filtering device, turning on the lighting device, reacting the stripping solution with the filter element, and adsorbing the dissolved oxygen of the stripping solution; transferring the filtered stripping solution to the plurality of spray heads of the stripping tank, spraying and stripping the photoresist layer; and after completing the stripping, removing the remaining photoresist stripping solution by the air knife, and removing the substrate from the outlet.

Further, before the step of transferring the substrate to the inlet, and irradiating the photoresist layer to be removed with an ultraviolet lamp, the method further includes: turning on the pump, sucking the stripping solution into the filtering device, and turning on the lighting device; conveying the filtered stripping solution into the stripping tank through a pipe, and then refluxing the filtered stripping solution into the stripping tank through the bottom of the stripping tank.

Further including turning on the heating device, heating the filter element, and releasing the dissolved oxygen adsorbed by the MOF material.

The technical effect of the present disclosure is to provide a photoresist stripping device and a photoresist stripping method. Through disposing a metal-organic framework (MOF) material in a filter element of the filtering device, the MOF material is configured to adsorb a dissolved oxygen of the stripping solution in a visible light environment, thereby reducing the difference in oxygen concentration between the inside and outside of the gap, and alleviating a hollowing out phenomenon of copper caused by stripping the photoresist of the substrate. Further, when reaching a saturation step, can heat or emit ultraviolet light to release the dissolved oxygen to make the filter material recyclable.

DETAILED DESCRIPTION OF PREFERRED EMBODIMENTS

In order to make the purpose, technical solution, and effect of the present disclosure clearer and more specific, the present disclosure is described in detail below with reference to the accompanying figures and embodiments. It should be understood the specific embodiments described herein are only used to explain and not used to limit the present disclosure.

Figure 1:
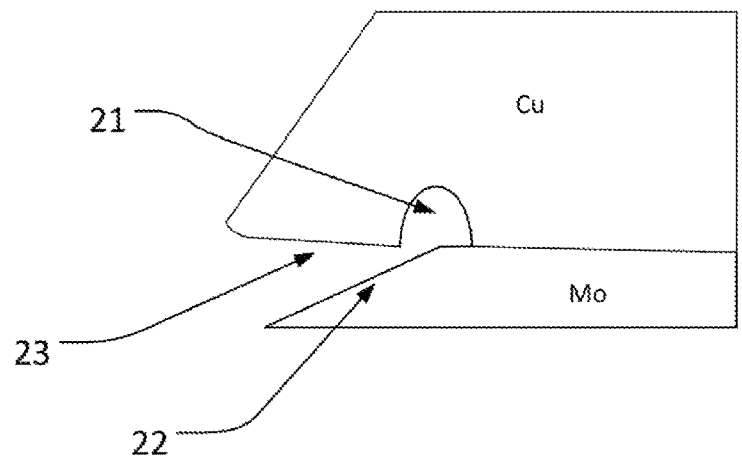
FIG. 1 is a schematic structural diagram of a Cu undercut phenomenon of the prior art.
Figure 2:
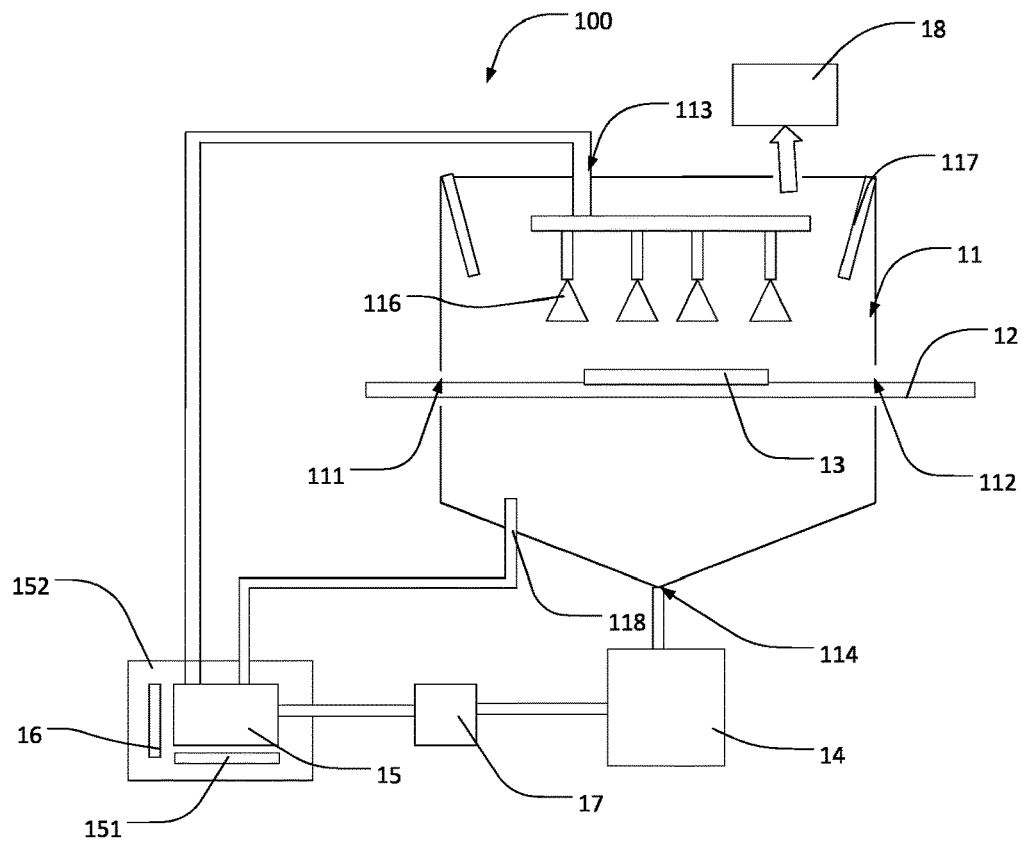
FIG. 2 is a schematic structural diagram of a photoresist stripping device of the present disclosure.

As shown in FIG. 2, the present disclosure provides a photoresist stripping device 100 including a conveyor belt 12, a liquid storage tank 14, a filtering device 15, a lighting device 16, a stripping tank 11, and a vacuum device 18.

The conveyor belt 12 is configured to carry and convey a substrate 13 having a photoresist layer to be stripped. The conveyor belt 12 is driven by a motor.

The liquid storage tank 14 is configured to store a stripping solution and recycles the stripping solution, wherein the liquid storage tank 14 has a liquid discharge port and discharges the stripping solution from the liquid discharge port.

The filter device 15 includes a filter element having a metal-organic framework (MOF) material, and the filter device 15 is connected to the liquid storage tank 14.

Figure 3:
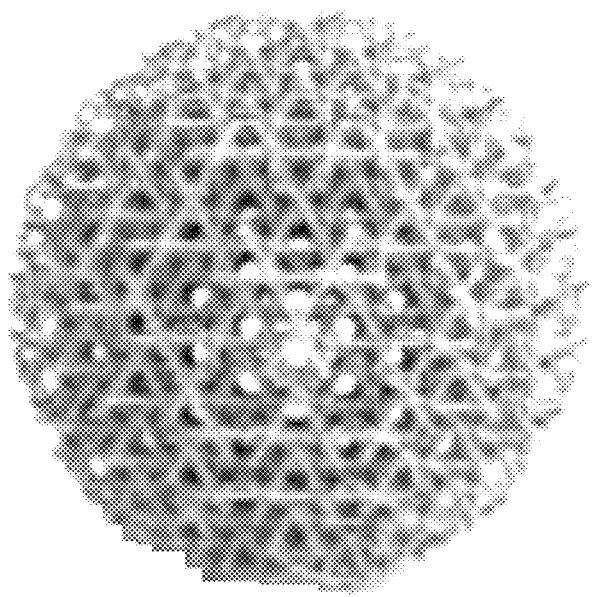
FIG. 3 is a schematic diagram of a macrostructure of a MOF material of the present disclosure.
Figure 4:
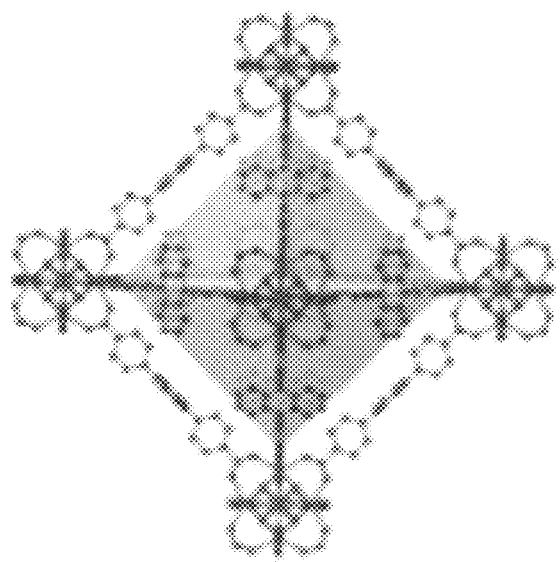
FIG. 4 is an enlarged partial structural diagram of FIG. 3.

As shown in FIG. 3, FIG. 3 is a schematic diagram of a macrostructure of the MOF material of the present disclosure. As shown in FIG. 4, FIG. 4 is an enlarged partial structural diagram of FIG. 3. The frame of the MOF material can be seen, wherein the metal ions and organic ligands are formed by self-assembly to form a crystalline porous material with a periodic network structure, which has the advantages of high porosity, low density, large specific surface area, regular channel, adjustable pore size, topological structure diversity, and tailorability.

Figure 5:
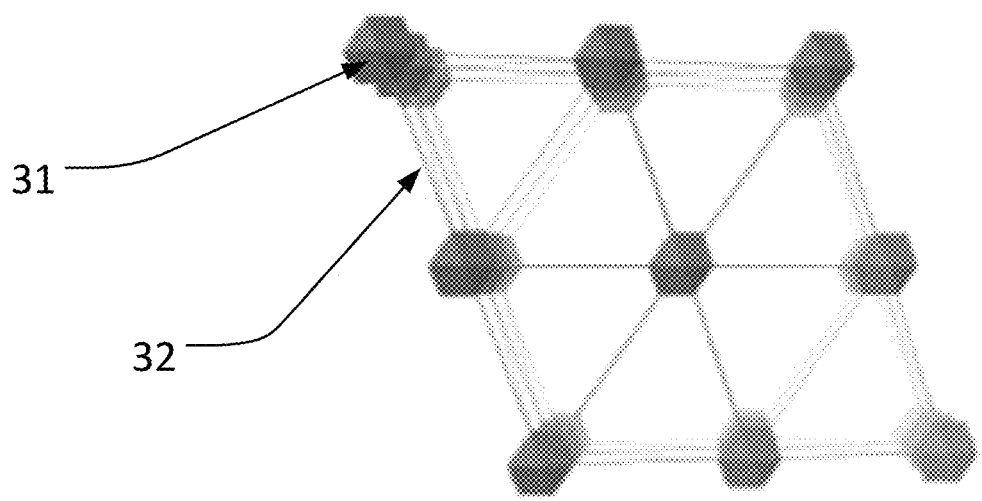
FIG. 5 is a schematic diagram of a microstructure of the MOF material of the present disclosure.

As shown in FIG. 5, FIG. 5 is a schematic diagram of a microstructure of the MOF material of the present disclosure, which includes an organic framework portion 32 and an aptamer portion 31. The molecular structure formula of the organic framework 32 is:

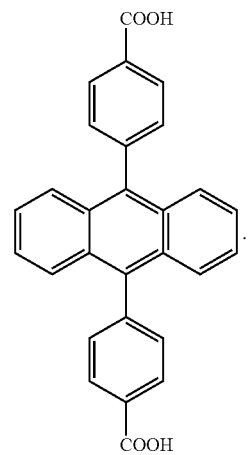

Figure 6:
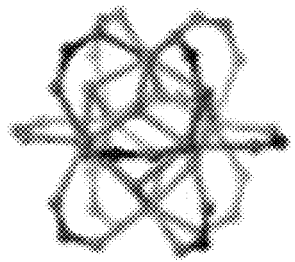
FIG. 6 is a schematic structural diagram of a modified ligand portion of FIG. 5.

The structure of the aptamer portion 31 is shown in FIG. 6.

The filtering device 15 further includes a heating device 151 and a cooling device 152.

The MOF material is configured to adsorb a dissolved oxygen of the stripping solution in a visible light environment, to reduce the dissolved oxygen during the stripping, thereby reducing the difference in oxygen concentration between the inside and outside of the gap, and alleviating a hollowing out phenomenon of copper.

The heating device 151 is configured to heat the filter element to release the dissolved oxygen adsorbed by the MOF material. The heating device 151 may be an ultraviolet lamp or an electric heating device 151.

Figure 7:
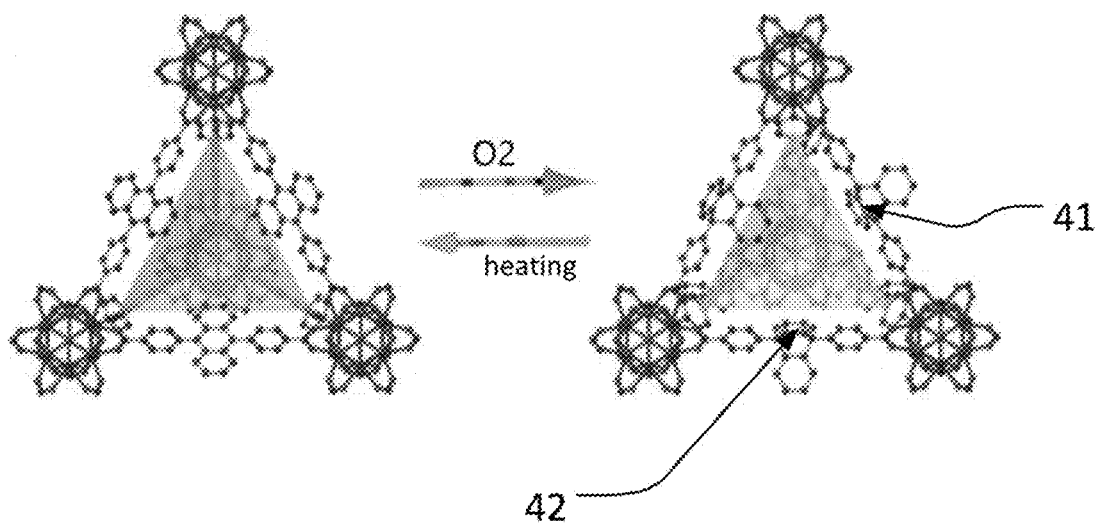
FIG. 7 is a schematic structural diagram of a reversible reaction between the MOF material and oxygen of the present disclosure.

As shown in FIG. 7, FIG. 7 is a schematic structural diagram of a reversible reaction between the MOF material and oxygen of the present disclosure, which is a reversible reaction, so the MOF material can be recyclable. The position marks 41 and 42 of FIG. 7 are chemical structures resulting from adsorbing oxygen.

The lighting device 16 is configured to light the filtering device 15 because the MOF material needs to be in a visible light environment to adsorb oxygen. The lighting device 16 includes an incandescent lamp.

The filtering device 15 further includes a cooling device 152 configured to consume the heat generated by the heating device 151 and maintain a constant temperature environment of the filtering device 15. The cooling device 152 is a water cooling system.

The stripping tank 11 is disposed on the liquid storage tank 14 and the filtering device 15 and includes an inlet 111, an outlet 112, a first connection hole 113, and a second connection hole 114 wherein the first connection hole 113 is connected to the filter device 15 and configured to receive the stripping solution from the filter device 15 to spray the substrate 13, the second connection hole 114 is connected to the liquid storage tank 14 to recycle the stripping solution.

The conveyor belt 12 penetrates the outlet 112 and the inlet 111.

A cross-section of the bottom of the stripping tank 11 is an isosceles triangle, and the second connection hole 114 is disposed on a center of the bottom of the stripping tank 11. The stripping solution may flow from the bottom toward the center of the stripping tank 11 and then flow to the liquid storage tank 14 through the second connection hole 114.

The stripping tank 11 further includes a plurality of spray heads 116, a pipe 118, and an air knife 117.

The plurality of spray head 116 are arranged in an array on the top of the glass tank and are connected to the filter device 15 through the first connection hole 113 to spray the stripping solution on the photoresist layer.

The air knife 117 is disposed on the outlet 112 to strip the photoresist.

The pipe 118 penetrates the bottom of the stripping tank 11, and the pipe 118 is connected to the filtering device 15. Before the device is operated, that is, when the substrate 13 is not yet transferred into the stripping tank 11, the filtered stripping solution is conveyed into the stripping tank 11 through the pipe 118 and then refluxes into the stripping tank 11 through the bottom of the stripping tank 11, for regulating the device and adjusting the parameters of temperature and light.

The filtering device 15 is connected to the liquid storage tank 14 through a pump 17. The vacuum device 18 is configured to evacuate the stripping tank 11.

The present disclosure also provides a photoresist stripping method, including:

Step S1: Providing a substrate 13 having a photoresist layer to be stripped and the photoresist stripping device 100.

Step S2: Turning on the pump 17, drawing the stripping solution into the filtering device 15, and turning on the lighting device 16.

Step S3: Conveying the filtered stripping solution into the stripping tank 11 through a pipe 118, and then refluxing the filtered stripping solution into the stripping tank through the bottom of the stripping tank. In steps S1 and S2, the filtered stripping solution is conveyed into the stripping tank 11 through the pipe 118, and then refluxes into the stripping tank 11 through the bottom of the stripping tank 11, for regulating the device and adjusting the parameters of temperature and light.

Step S4: Transferring the substrate 13 to the inlet 111.

Step S5: Pumping the stripping solution through the pump 17 to the filtering device 15, turning on the lighting device 16, reacting the stripping solution with the filter element, and adsorbing the dissolved oxygen of the stripping solution.

Step S6: Transferring the filtered stripping solution to the plurality of spray heads 116 of the stripping tank 111, spraying and stripping the photoresist layer.

Step S7: After completing the stripping, removing the remaining photoresist stripping solution by the air knife 117, and removing the substrate 13 from the outlet 112.

Step S8: Turning on the heating device 151, heating the filter element, and releasing the dissolved oxygen adsorbed by the MOF material to recycle the MOF material.

The present disclosure provides a photoresist stripping device 100 and a photoresist stripping method. Through disposing a MOF material in a filter element of the filtering device, the MOF material is configured to adsorb a dissolved oxygen of the stripping solution in a visible light environment, thereby reducing the difference in oxygen concentration between the inside and outside of the gap, and alleviating hollowing out phenomenon of copper caused by stripping the photoresist of the substrate 13. Further, when reaching a saturation step, can heat or emit ultraviolet light to release the dissolved oxygen, thereby recycling the filter material.

It should be noted that, for those of ordinary skill in the art, without departing from the principle of the present disclosure, several improvements and retouches can be made, and these improvements and retouches are within the protection scope of the present disclosure.

What is claimed is:

1. A photoresist stripping device, comprising:
   a conveyor belt configured to carry and convey a substrate having a photoresist layer to be stripped;
   a liquid storage tank configured to store a stripping solution and comprising a liquid discharge port;
   a filtering device comprising a filter element having a metal-organic framework (MOF) material, wherein the filtering device is connected to the liquid storage tank, and the MOF material is configured to adsorb dissolved oxygen of the stripping solution through a reversible reaction in a visible light environment;
   a lighting device configured to light the filtering device;
   a stripping tank disposed on the liquid storage tank and the filtering device and comprising an inlet, an outlet, a first connection hole, and a second connection hole, wherein the first connection hole is connected to the filtering device and configured to receive the stripping solution from the filtering device to spray the substrate, the second connection hole is connected to the liquid storage tank to recycle the stripping solution, the stripping tank further comprises a plurality of spray heads disposed in an array on a top of the stripping tank and connected to the filtering device through the first connection hole to spray the stripping solution on the photoresist layer, and
   an air knife disposed on the outlet to remove the stripping solution on the substrate;
   wherein the conveyor belt penetrates the outlet and the inlet horizontally under the plurality of spray heads and above the second connection hole;
   wherein the stripping tank comprises a pipe that penetrates a bottom of the stripping tank, and the pipe is connected to the filtering device to covey the filtered stripping solution through the pipe and then refluxes into the stripping tank through the bottom of the stripping tank for regulating the photoresist stripping device and adjusting the parameters of temperature and light even before the substrate is conveyed into the stripping tank.

2. The photoresist stripping device as claimed in claim 1, wherein:
the filtering device further comprises a heating device configured to heat the filter element to release the dissolved oxygen adsorbed by the MOF material.

3. The photoresist stripping device as claimed in claim 2, wherein:
the filtering device further comprises a cooling device configured to consume heat generated by the heating device and maintain a constant temperature environment of the filtering device.

4. The photoresist stripping device as claimed in claim 2, wherein:
the heating device comprises an ultraviolet lamp; and/or
the lighting device comprises an incandescent lamp; and/or
the filtering device is connected to the liquid storage tank through a pump.

5. The photoresist stripping device as claimed in claim 1, wherein:
a cross-section of a bottom of the stripping tank is an isosceles triangle, and the second connection hole is disposed on a center of the bottom of the stripping tank.

6. The photoresist stripping device as claimed in claim 1, further comprising:
a vacuum device configured to evacuate the stripping tank.

\* \* \* \* \*